(12) United States Patent
Ahmed et al.

(10) Patent No.: US 11,978,527 B2
(45) Date of Patent: *May 7, 2024

(54) CONDUCTIVE INTERCONNECTS AND METHODS OF FORMING CONDUCTIVE INTERCONNECTS

(71) Applicant: Micron Technology, Inc., Boise, ID (US)

(72) Inventors: Raju Ahmed, Boise, ID (US); David A. Kewley, Boise, ID (US); Dave Pratt, Meridian, ID (US); Yung-Ta Sung, Boise, ID (US); Frank Speetjens, Boise, ID (US); Gurpreet Lugani, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/693,119

(22) Filed: Mar. 11, 2022

(65) Prior Publication Data

US 2022/0199123 A1 Jun. 23, 2022

Related U.S. Application Data

(62) Division of application No. 16/718,454, filed on Dec. 18, 2019, now Pat. No. 11,328,749.

(51) Int. Cl.
*H01L 23/532* (2006.01)
*G11C 5/06* (2006.01)

(52) U.S. Cl.
CPC .......... *G11C 5/06* (2013.01); *H01L 23/53257* (2013.01); *H01L 23/5329* (2013.01)

(58) Field of Classification Search
CPC ......... H01L 21/76801–76814; H01L 45/1683; H01L 2221/10–1089;
(Continued)

(56) References Cited

U.S. PATENT DOCUMENTS 6,235,632 B1 5/2001 Nogami et al.
6,251,790 B1 6/2001 Jeong
(Continued)

FOREIGN PATENT DOCUMENTS

CN 101238572 8/2008
CN 105637622 6/2016
(Continued)

OTHER PUBLICATIONS

TW TW 109142081 Search Rept Trans, dated Sep. 14, 2021, Micron Technology, Inc.
(Continued)

*Primary Examiner* — Cuong B Nguyen
(74) *Attorney, Agent, or Firm* — Wells St. John P.S.

(57) ABSTRACT

Some embodiments include an integrated assembly having an interconnect over a first conductive structure and coupled with the first conductive structure. The interconnect includes a conductive core. The conductive core has a slender upper region and a wide lower region. The upper region joins to the lower region at a step. A liner laterally surrounds the lower region of the conductive core. The liner has an upper surface which is substantially coplanar with the step. An insulative collar is over and directly against both an upper surface of the step and the upper surface of the liner. The insulative collar laterally surrounds and directly contacts the slender upper region. A second conductive structure is over and directly against a region of the insulative collar, and is over and directly against an upper surface of the slender upper region. Some embodiments include methods of forming integrated assemblies.

20 Claims, 12 Drawing Sheets

(58) Field of Classification Search
CPC .............. H01L 2224/05006–05093; H01L 2224/05546; H01L 21/02063; H01L 21/486; H01L 21/76897; H01L 23/481–4855; H01L 23/5226; H01L 23/5384; H01L 2225/06541–06548; H01L 21/76877–76898; H01L 23/49827; H01L 23/53257; H01L 23/5329; H01L 21/76804; H01L 21/76844; H01L 21/76865; H01L 21/76883; H01L 21/76831; H01L 21/76838; G11C 5/06
See application file for complete search history.

(56) References Cited

U.S. PATENT DOCUMENTS

| | | | |
|---|---|---|---|
| 7,157,371 | B2 | 1/2007 | Hecht |
| 7,429,529 | B2 | 9/2008 | Farnworth et al. |
| 9,105,636 | B2 | 8/2015 | Liu |
| 9,449,921 | B1 | 9/2016 | Basker et al. |
| 9,564,442 | B2 | 2/2017 | Tang |
| 9,627,256 | B2 | 4/2017 | Tsai et al. |
| 9,748,180 | B2 | 8/2017 | Puri et al. |
| 10,283,698 | B2 * | 5/2019 | Ko .............. H10N 50/01 |
| 11,043,419 | B2 | 6/2021 | Kume |
| 11,328,749 | B2 * | 5/2022 | Ahmed ......... H01L 23/53257 |
| 2005/0287803 | A1 | 12/2005 | Lee |
| 2014/0239501 | A1 | 8/2014 | Tsai et al. |
| 2014/0252622 | A1 | 9/2014 | Peng et al. |
| 2015/0091172 | A1 | 4/2015 | Ko et al. |
| 2015/0262864 | A1 | 9/2015 | Okamoto et al. |
| 2017/0170118 | A1 | 6/2017 | Fan et al. |
| 2020/0381301 | A1 | 12/2020 | Hong et al. |

FOREIGN PATENT DOCUMENTS

| | | |
|---|---|---|
| CN | 202011455843.2 | 9/2023 |
| TW | 200741829 | 11/2007 |
| TW | 201612954 | 4/2016 |
| TW | 202011515 | 3/2020 |

OTHER PUBLICATIONS

TW TW 110100737 Search Rept Trans, dated Jan. 11, 2022, Micron Technology, Inc.

* cited by examiner

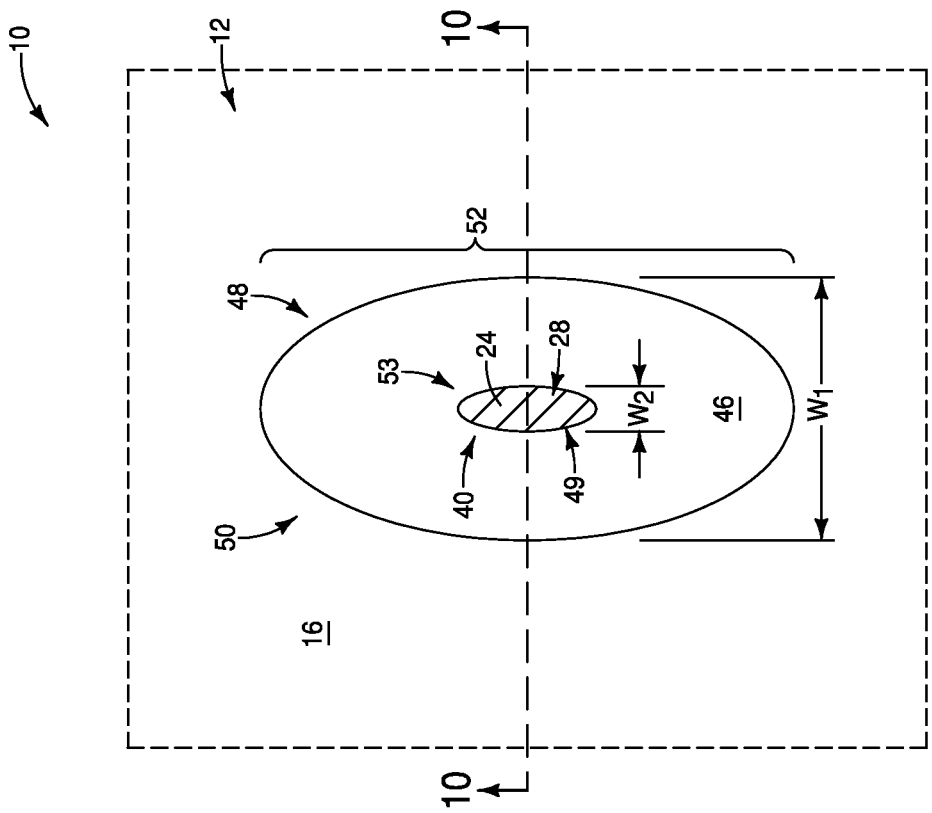
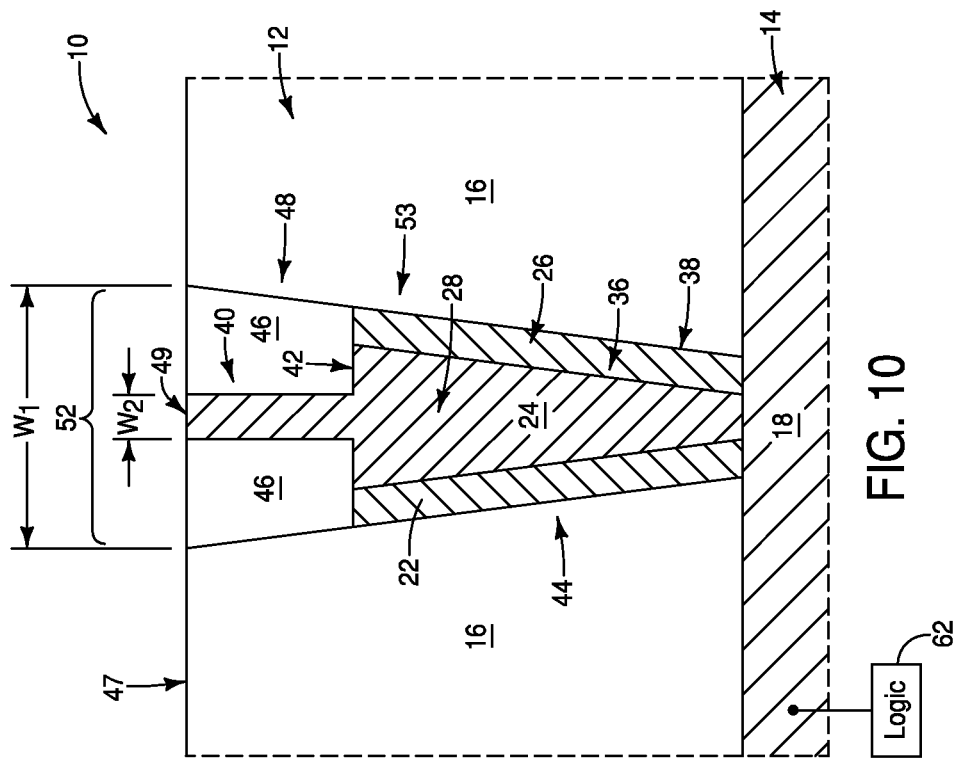

CONDUCTIVE INTERCONNECTS AND METHODS OF FORMING CONDUCTIVE INTERCONNECTS

RELATED PATENT DATA

This patent resulted from a divisional of U.S. patent application Ser. No. 16/718,454 filed Dec. 18, 2019, which is hereby incorporated by reference herein.

TECHNICAL FIELD

Integrated assemblies, memory arrays, conductive interconnects, and methods of forming conductive interconnects.

BACKGROUND

Memory is often incorporated into integrated circuitry. The memory may be used, for example, in computer systems for storing data.

Memory may be provided as a large array of memory cells. Wordlines (access lines) and bitlines (digit lines, sense lines) may be provided across the array such that individual memory cells may be uniquely addressed through the combination of a wordline and a bitline.

Conductive interconnects may be utilized to electrically couple circuitry from a lower level to circuitry of an upper level; and in some embodiments may be utilized for coupling wordlines with control circuitry (e.g., driver circuitry) and/or for coupling bitlines with sensing circuitry (e.g., sense-amplifier-circuitry).

A continuing goal of integrated circuit fabrication is to increase the level of integration (i.e., to scale circuitry to smaller dimensions). Wordlines and bitlines may become increasingly tightly packed across a memory array with increasing levels of integration.

Difficulties are encountered in increasing the level of integration of memory in that it becomes increasingly difficult to make suitable connections to the wordlines and bitlines. It is desired to develop new conductive interconnects suitable for making connections to wordlines and bitlines, and new methods of fabricating such interconnects. It may also be desirable for the new conductive interconnects to be suitable for making connections to tightly-packed integrated circuit components other than wordlines and bitlines.

Examples of the difficulties involved in making electrical connections to wordlines and bitlines are described with reference to FIGS. 1A, 1B, 2A and 2B.

Referring to FIGS. 1A and 1B, an assembly 300 includes an electrical interconnect 302 extending through an insulative mass 304. The electrical interconnect couples a lower conductive structure 306 with an upper constructive structure 308b. The upper conductive structure 308b is shown to be one of several similar conductive lines 308 (with other conductive lines being labeled 308a and 308c). The conductive lines 308 may be wordlines or bitlines.

The electrical interconnect 302 is shown to comprise a conductive liner 310 which laterally surrounds a conductive core 312. The liner 310 may comprise metal nitride (e.g., titanium nitride or tungsten nitride), and the conductive core 312 may comprise metal (e.g., tungsten). The liner 310 may be provided to enhance adhesion between the metal of the conductive core 312 with the insulative material of the mass 304 and/or to provide a seed layer during deposition of the metal of the conductive core 312.

FIGS. 1A and 1B show a desired arrangement in which only the central line 308b is electrically coupled with the interconnect 302. However, problems may occur with increased levels of integration which lead to one or both of the conductive lines 308a and 308c shorting with the interconnect 302. For instance, FIGS. 2A and 2B show the assembly 300 in a problematic arrangement in which the line 308c is shorted to the interconnect 302 (with such shorting occurring in an illustrated region 314 shown in FIG. 2B). The shorting may result from misalignment of the line 308c (as shown) and/or from misalignment of the interconnect 302.

It is desired to alleviate or prevent the problematic shorting problems described with reference to FIGS. 2A and 2B.

BRIEF DESCRIPTION OF THE DRAWINGS

FIGS. 7-10 are diagrammatic cross-sectional side views of a region of an integrated assembly at sequential process stages of an example method. The process stage of FIG. 7 may follow that of FIG. 6.

FIG. 10A is a diagrammatic top-down view of a region of the integrated assembly of FIG. 10. The view of FIG. 10 is along the line 10-10 of FIG. 10A.

DETAILED DESCRIPTION OF THE ILLUSTRATED EMBODIMENTS

Some embodiments include a conductive interconnect having a slender upper region and a wide lower region. The upper region joins to the lower region at a step. A liner may laterally surround the lower portion of the conductive interconnect. The liner may have an upper surface which is substantially coplanar with the step. An insulative collar may laterally surround the slender upper region, and may be over and directly against both an upper surface of the step and the upper surface of the liner. Some embodiments include methods of forming integrated assemblies. Example embodiments are described with reference to FIGS. 3-19.

Figure 3:
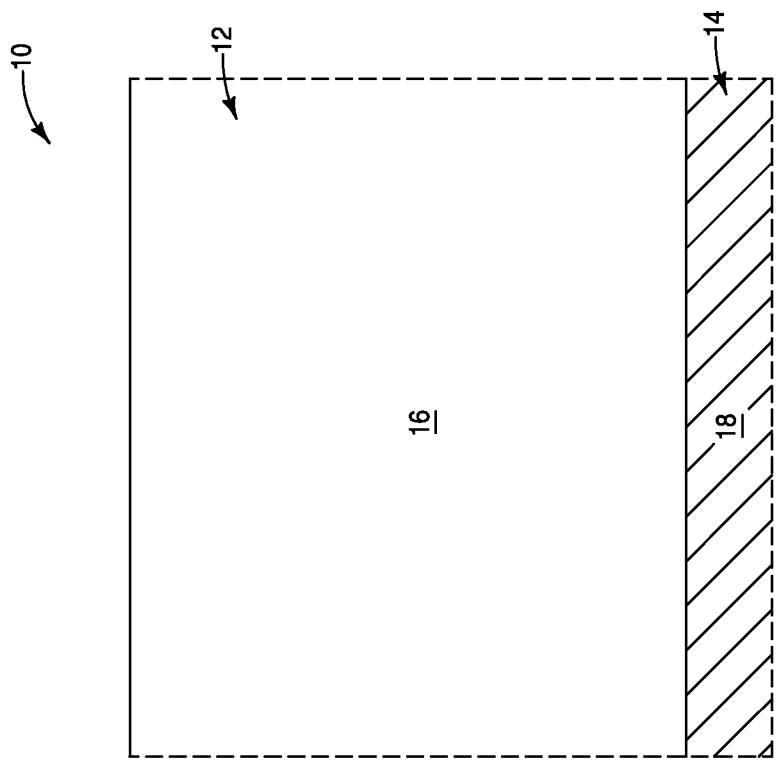

Referring to FIG. 3, an assembly 10 includes an insulative mass 12 over a conductive structure 14.

The insulative mass 12 comprises an insulative material 16. Such insulative material may comprise any suitable composition(s); and in some embodiments may comprise, consist essentially of, or consist of one or more of silicon dioxide, silicon nitride, aluminum oxide, hafnium oxide, etc.

The conductive structure 14 comprises an electrically conductive material 18. The material 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the material 18 may comprise one or more of copper (Cu), silver (Ag), aluminum (Al), tungsten (W), platinum (Pt), palladium (Pd), conductively-doped silicon, metal nitride, metal silicide, etc.

The conductive structure 14 may be referred to as a first conductive structure to distinguish it from other conductive structures formed at subsequent process stages.

The conductive structure 14 may be electrically coupled with logic circuitry (not shown); such as for example, one or both of wordline-driver-circuitry and sense-amplifier-circuitry. The logic circuitry may comprise CMOS, and may be under the conductive structure 14. In some embodiments, the conductive structure 14 may be supported by a base (not shown), and the logic circuitry may be over such base and under the conductive structure 14.

The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

Figure 4:
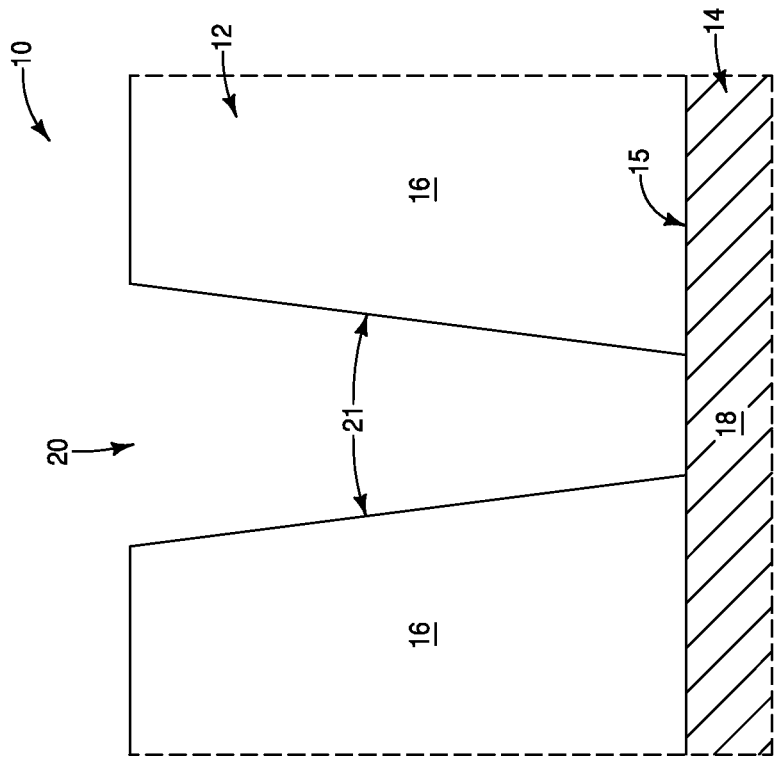
FIGS. 3-6 are diagrammatic cross-sectional side views of a region of an integrated assembly at sequential process stages of an example method.

Referring to FIG. 4, an opening 20 is formed to extend through the insulative mass 12 to an upper surface 15 of the conductive structure 14. The opening 20 has sidewalls 21. The sidewalls 21 are shown to be somewhat tapered. In other embodiments the sidewalls 21 may be more tapered, less tapered, or even not tapered. Also, although the sidewalls are shown to be straight, in other embodiments at least some regions of the sidewalls may be curved.

In the illustrated embodiment, the opening 20 stops at the top surface 15 of the conductive structure 14. In other embodiments, the opening 20 may penetrate into the conductive structure 14.

Figure 5:
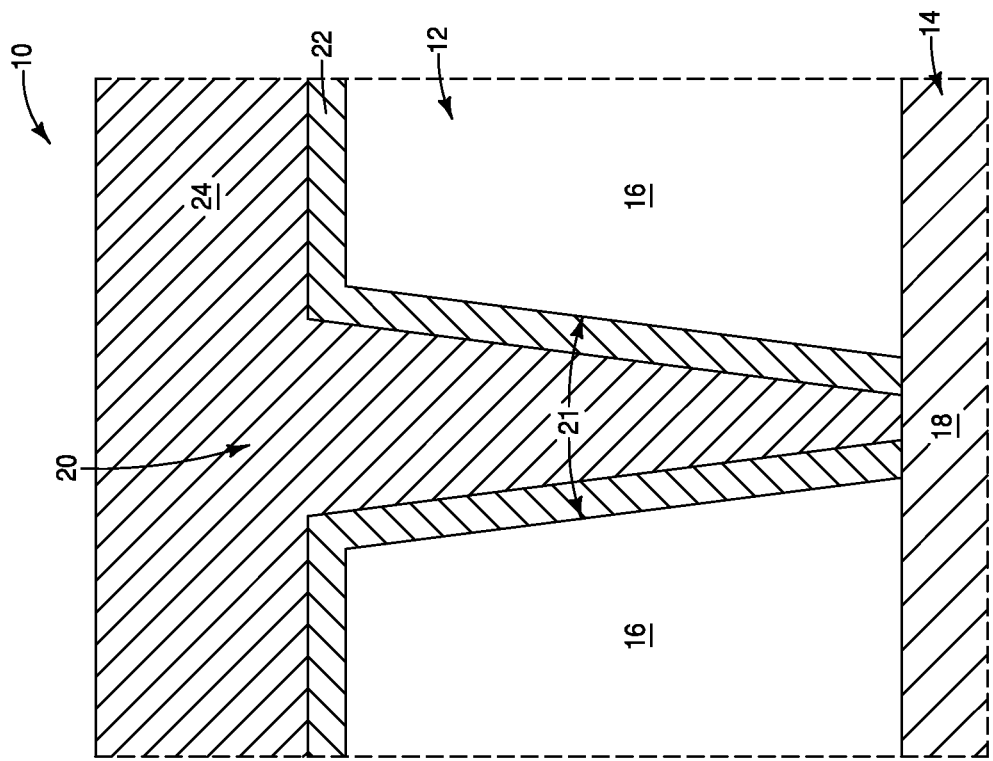

Referring to FIG. 5, a liner material 22 is formed over the mass 12 and within the opening 20. The liner material 22 lines the sidewalls 21 of the opening 20.

The liner material 22 is shown to be electrically conductive. However, it is to be understood that in some embodiments the liner material may be insulative or semiconductive.

The liner material 22 may comprise any suitable composition(s). For instance, the liner material 22 may be an insulative material; and may comprise, consist essentially of, or consist of one or more of silicon nitride, silicon dioxide, aluminum oxide, hafnium oxide, zirconium oxide, etc. As another example, the liner material 22 may be semiconductive; and may comprise, consist essentially of, or consist of one or both of silicon and germanium. As another example, the liner material 22 may be conductive, and may comprise, consist essentially of, or consist of one or more of metal nitride, metal silicide and metal carbide. In some embodiments, the liner material 22 may comprise one or both of tungsten nitride and titanium nitride.

A conductive core material 24 is formed within the opening 20 and along the lined sidewalls 21. The core material 24 directly contacts the first conductive structure 14 in the shown embodiment. In other embodiments, the liner material 22 may be electrically conductive and may be along a bottom of the opening 20 so that the liner material 22 is between the conductive material 24 and the conductive structure 14.

The conductive core material 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive core material 24 may comprise, consist essentially of, or consist of one or more metals. For instance, the conductive core material 24 may comprise, consist essentially of, or consist of tungsten.

The liner material 22 may be utilized to enhance adhesion of the core material 24 to the insulative material 16 of the mass 12 and/or may be utilized as a seed layer to promote growth of the core material 24 during deposition of such core material.

In the illustrated embodiment, the liner material 22 is a single homogeneous composition, and the core material 24 is also a single homogeneous composition. In other embodiments, the liner material 22 may comprise a laminate of two or more different compositions; and/or the core material 24 may comprise a laminate of two or more different compositions.

Figure 6:
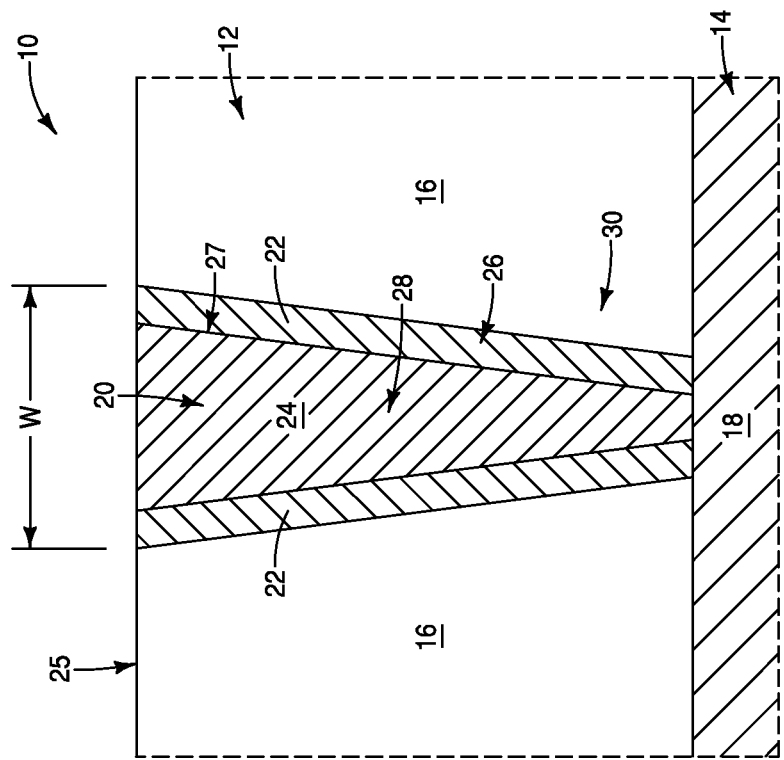

Referring to FIG. 6, the assembly 10 is subjected to planarization (e.g., chemical-mechanical polishing, CMP) to form a substantially planar surface 25 which extends across the insulative mass 12, the liner material 22 and the core material 24. The surface 25 is referred to as being "substantially planar" to indicate that the surface is planar to within reasonable tolerances of fabrication and measurement.

Figure 6A:
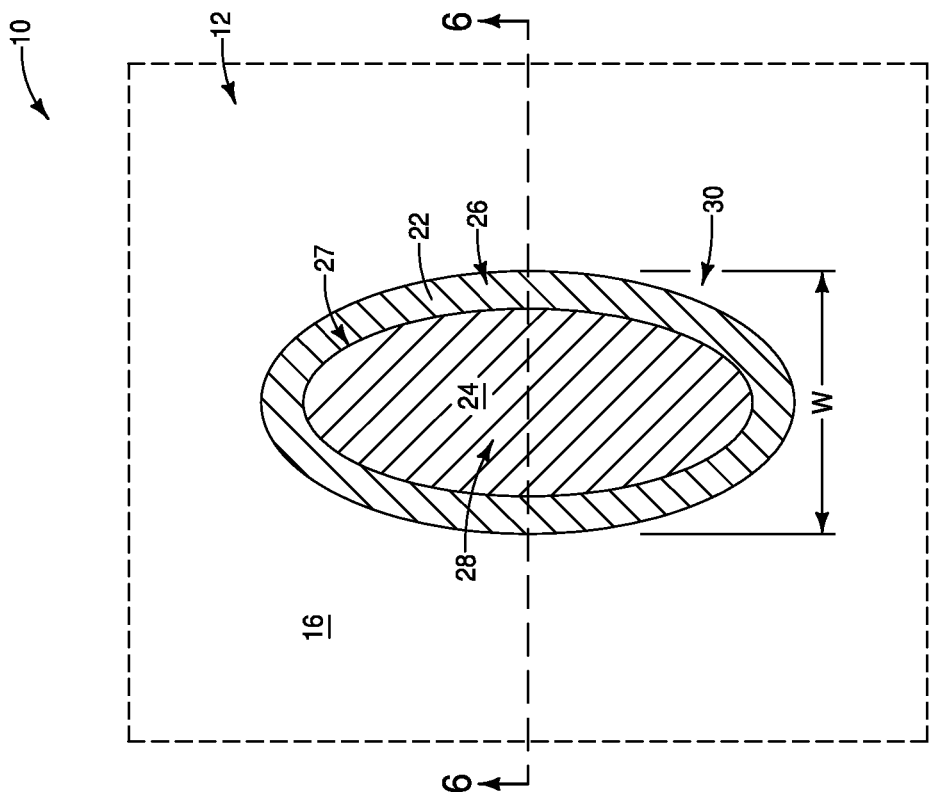
FIG. 6A is a diagrammatic top-down view of a region of the integrated assembly of FIG. 6. The view of FIG. 6 is along the line 6-6 of FIG. 6A.

The formation of the substantially planar surface 25 removes excess materials 22 and 24 from over the insulative mass 12, patterns the remaining liner material 22 into a liner 26 within the opening 20, and patterns the remaining core material 24 into a core structure 28 within the opening. The liner 26 laterally surrounds an outer peripheral surface (outer periphery) 27 of the core structure 28, as shown in the top-down view of FIG. 6A.

The liner 26 and core structure 28 together form a construction 30. Such construction has a width W along the cross-section of FIG. 6. Such width may comprise any suitable dimension, and in some embodiments may be within a range of from about 10 nm to about 30 nm.

Figure 7:
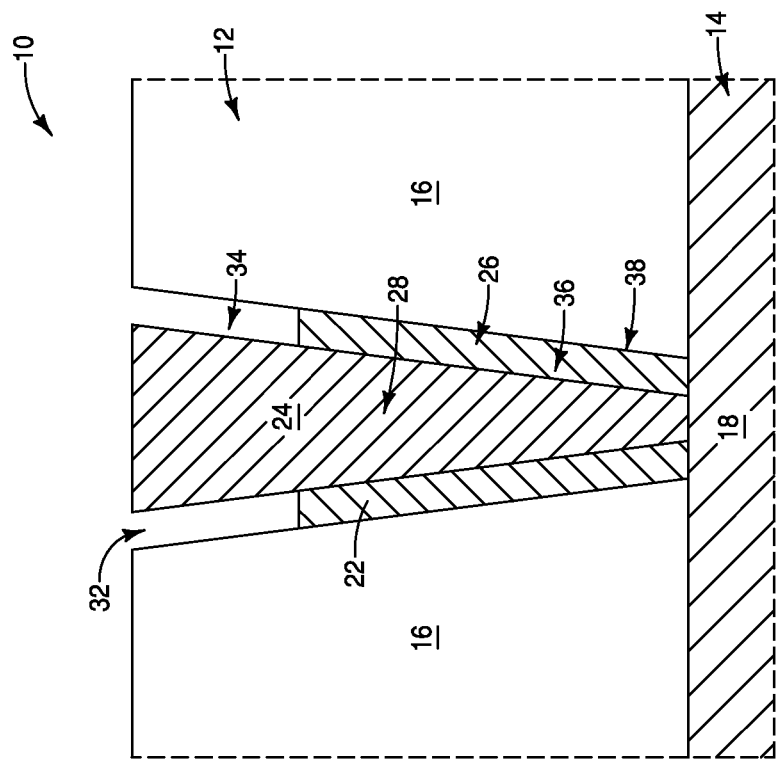

Referring to FIG. 7, an upper portion of the liner 26 is removed to form a moat 32 around an upper region 34 of the core structure 28. A lower portion 38 of the liner 26 remains as a collar under the moat 32. Such collar laterally surrounds a lower region 36 of the core structure 28.

In some embodiments, the liner material 22 comprises one or both of titanium nitride and tungsten nitride, the material 16 of the mass 12 comprises silicon dioxide, and the core material 24 comprises tungsten; and the liner material is removed with a wet vapor etch utilizing phosphoric acid.

Figure 8:
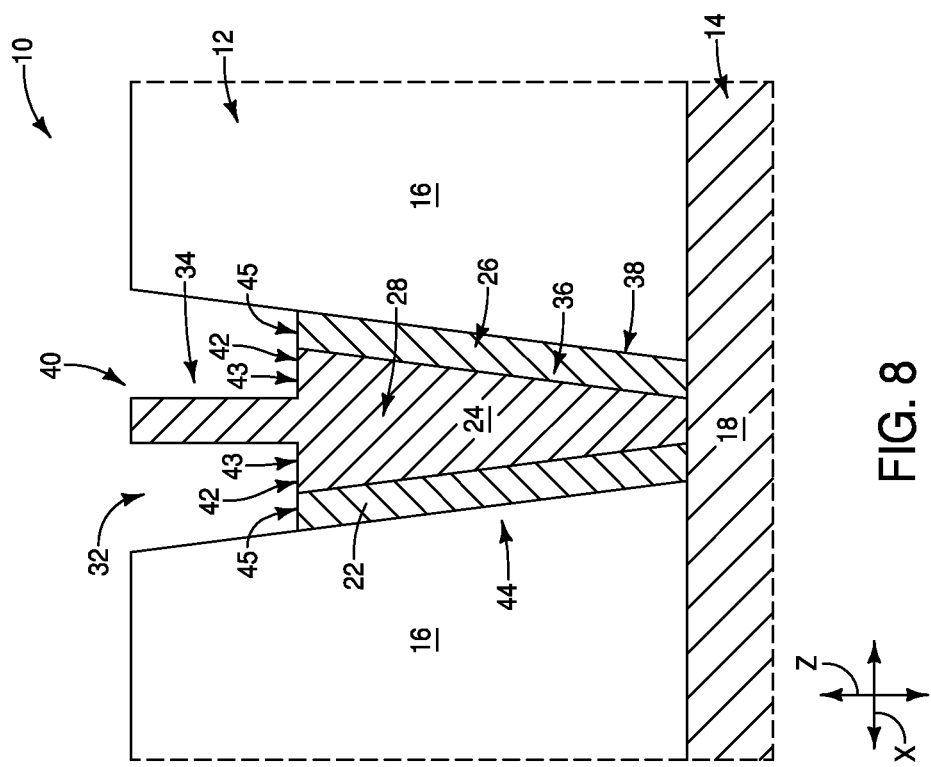

Referring to FIG. 8, a lateral width of the upper region 34 of the core structure 28 is reduced, and such converts the upper region to a slender region 40 of the core structure. The slender region 40 of the core structure 28 joins to the wide lower region 36 of the core structure 28 at a step 42. In the illustrated embodiment, the core structure 28 extends substantially vertically (i.e., extends along an illustrated z-axis), and the step 42 extends substantially horizontally (i.e. extends along an illustrated x-axis). The term "substantially vertically" means vertical to within reasonable tolerances of fabrication and measurement, and the term "substantially horizontally" means horizontal to within reasonable tolerances of fabrication and measurement. In some embodiments, the vertically-extending core structure 28 may be considered to extend substantially orthogonally relative to the horizontally-extending step 42, with the term "substantially orthogonally" meaning orthogonal to within reasonable tolerances of fabrication and measurement. In some embodiments, the vertical direction of the core structure 28 may be within about 100 of orthogonal to the horizontal direction of the step 42.

In the illustrated embodiment, the step 42 has a substantially planar surface 43, and the lower portion 38 of the liner 26 has an upper surface 45 which is substantially coplanar with the planar surface 43. In other embodiments, the step 42 and/or the lower portion 38 of the liner 26 may have a rounded upper surface, a non-horizontal upper surface, or any other suitable configuration.

In some embodiments, the lower portion 38 of the liner 26 may be considered to be configured as a collar 44 which laterally surrounds an outer periphery of the lower portion 36 of the core structure 28. Such collar may be referred to as a first collar to distinguish it from another collar formed at a later process stage. The collar 44 may be electrically conductive in some embodiments (e.g., may comprise one or more of titanium nitride, tungsten nitride, etc.). Alternatively, the collar 44 may be electrically insulative (e.g., may comprise one or more of silicon dioxide, silicon nitride, aluminum oxide, hafnium oxide, zirconium oxide, etc.). Alternatively, the collar 44 may be semiconductive (e.g., may comprise silicon, germanium, etc.).

The narrowing of the upper region 34 of the core structure 28 expands the moat 32.

The upper region 34 of the core structure 28 may be narrowed utilizing any suitable processing. For instance, in some embodiments the core structure may comprise tungsten, and may be narrowed utilizing an etch comprising one or both of fluorocarbon (e.g., CxFy, where x and y are numbers) and $BCl_3$ in combination with suitable oxidant (e.g., 02).

Figure 9:
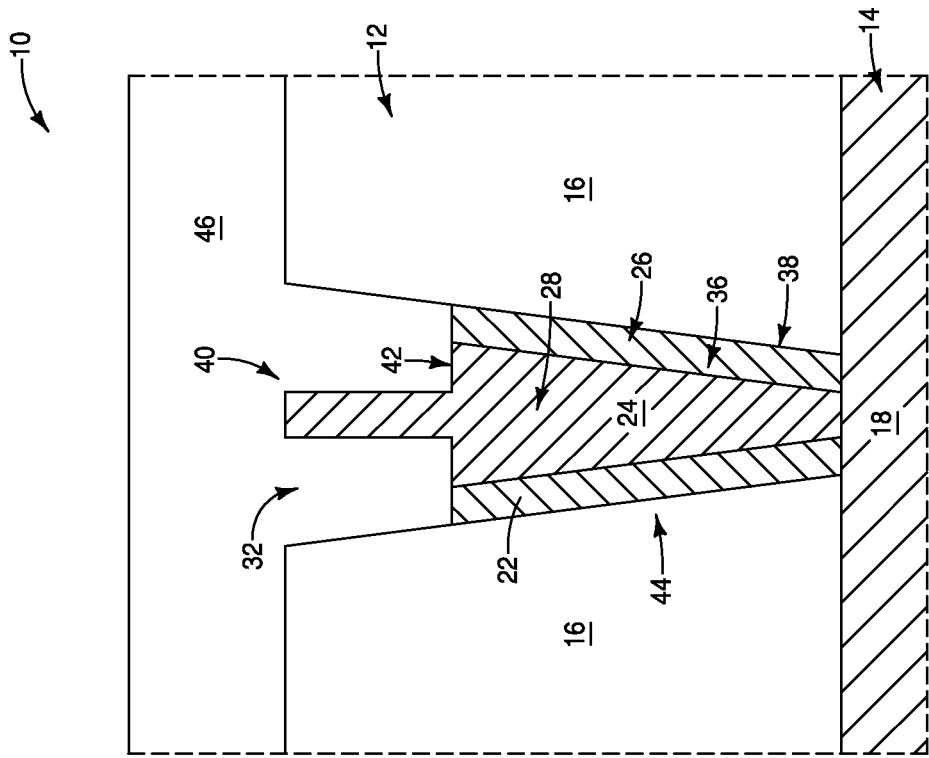

Referring to FIG. 9, an insulative material 46 is formed over the slender region 40 of the core structure 28, and within the moat 32. The insulative material 46 may comprise any suitable composition(s); and in some embodiments may comprise, consist essentially of, or consist of one or both of silicon nitride and silicon dioxide. The insulative material 46 may be formed with any suitable processing, and in some embodiments may be formed as a spin-on dielectric (SOD) or a spin-on glass (SOG).

Referring to FIG. 10, excess of the insulative material 46 is removed with a planarization process (e.g., CMP). Such forms a substantially planar surface 47 which extends across the insulative mass 12, the insulative material 46, and an upper surface 49 of the slender region 40 of the core structure 28. The substantially planar surface 47 may be referred to as a second substantially planar surface to distinguish it from the first substantially planar surface 25 described above with reference to FIG. 6.

The formation of the substantially planar surface 47 patterns the insulative material 46 into an insulative collar 48 which laterally surrounds the slender region 40 of the core structure 28.

The configuration of FIG. 10 shows the conductive structure 14 electrically coupled with logic circuitry 62. The coupling to such logic circuitry may be provided at any suitable process stage, including a process stage before or after the illustrated process stage of FIG. 10. In some embodiments, the logic circuitry 62 may comprise sense-amplifier circuitry and/or wordline-driver-circuitry.

FIG. 10A shows a top-down view of the assembly 10 at the process stage of FIG. 10. The insulative collar 48 and the slender region 40 may be together considered to form a construction 50, and such construction may be considered to comprise an upper surface region 52. Such construction has a first width $W_1$ along the cross-section of FIG. 10. The slender region 40 has a second width $W_2$ along the cross-section of FIG. 10. The ratio of the second width to the first width (i.e., $W_2/W_1$) may be within a range of from about 0.01 to about 0.9, and in some embodiments may be about 0.5. The width $W_1$ of FIGS. 10 and 10A may be about the same as the width W of FIG. 6.

The conductive core material 24 of FIGS. 10 and 10A may be considered to be part of a conductive interconnect 53 which is electrically coupled with the conductive structure 14. The liner material 22 may also be considered to be part of such electrical interconnect in embodiments in which the liner 22 is electrically conductive. In some embodiments, the conductive structure 14 may be referred to as a first conductive structure, and the interconnect 53 may be referred to as a second conductive structure. In some embodiments, the conductive core 28 of the interconnect 53 may be referred to as the second conductive structure.

Figure 10B:
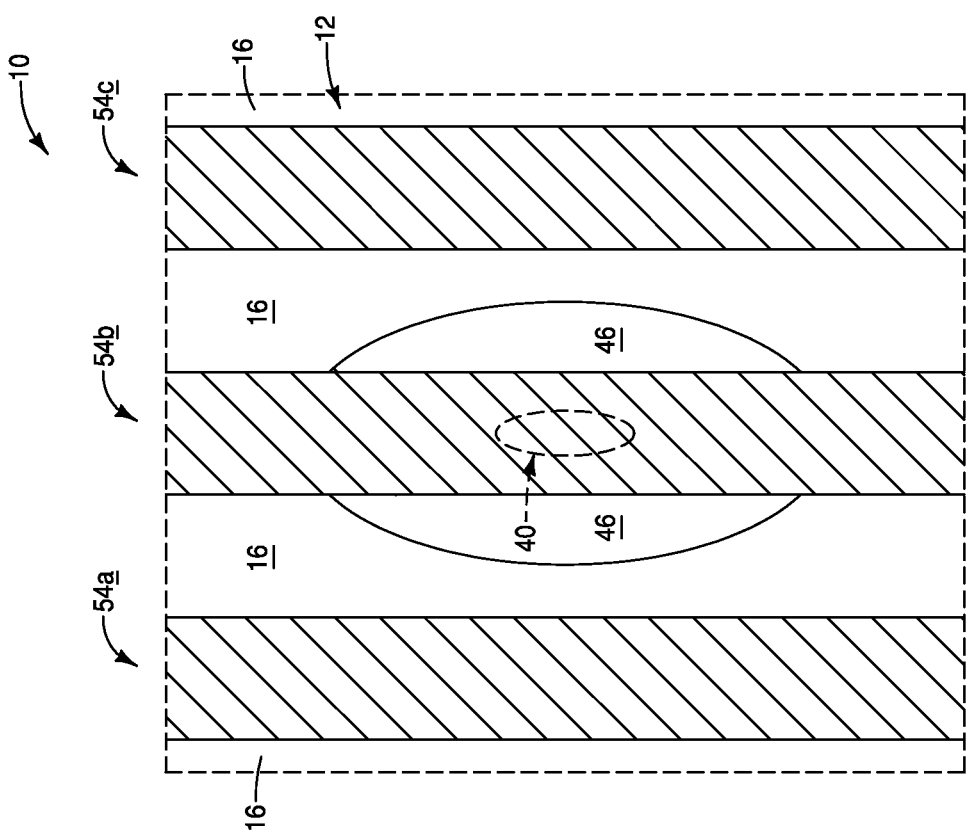
FIG. 10B is a diagrammatic top-down view of the region of the integrated assembly of FIG. 10A at a process stage subsequent to that of FIG. 10A.

Referring to FIG. 10B, conductive lines (conductive structures) 54 are formed over the insulative mass 12. In some embodiments, the lines 54 may be referred to as third conductive structures to distinguish them from the first conductive structure 14 (FIG. 10) and the second conductive structure 53 (FIG. 10). In some embodiments, the lines 54 may be referred to as second conductive structures, the structure 14 (FIG. 10) may be referred to as a first conductive structure, and the structure 53 (FIG. 10) may be referred to as an interconnect structure.

The conductive lines are labeled 54a-c so that they may be distinguished from one another. In some embodiments, the lines 54 may correspond to wordlines or digit lines (bitlines) extending across a memory array. The central line 54b is electrically coupled to the slender region 40 of the conductive core 28, and in some embodiments may be formed to be directly against the upper surface 49 of the conductive core material 24 of the slender region 40.

Figure 1B:
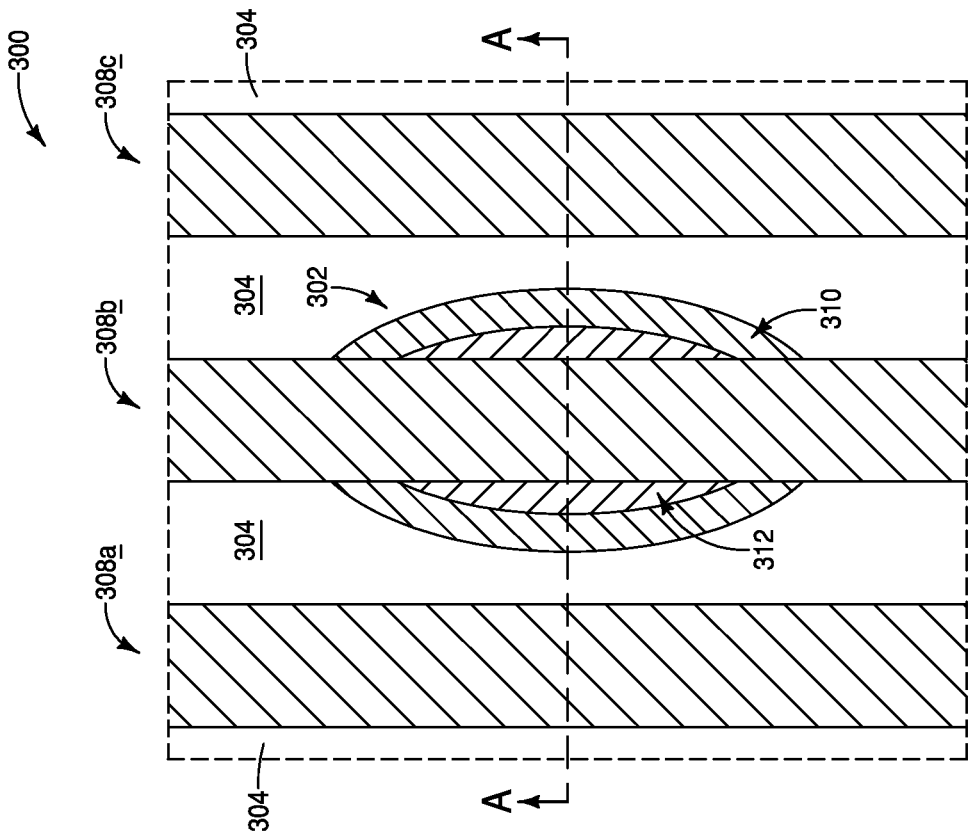
FIGS. 1A and 1B are a diagrammatic cross-sectional side view and a diagrammatic top-down view of a region of a prior art integrated assembly. The view of FIG. 1A is along the line A-A of FIG. 1B.
Figure 1A:
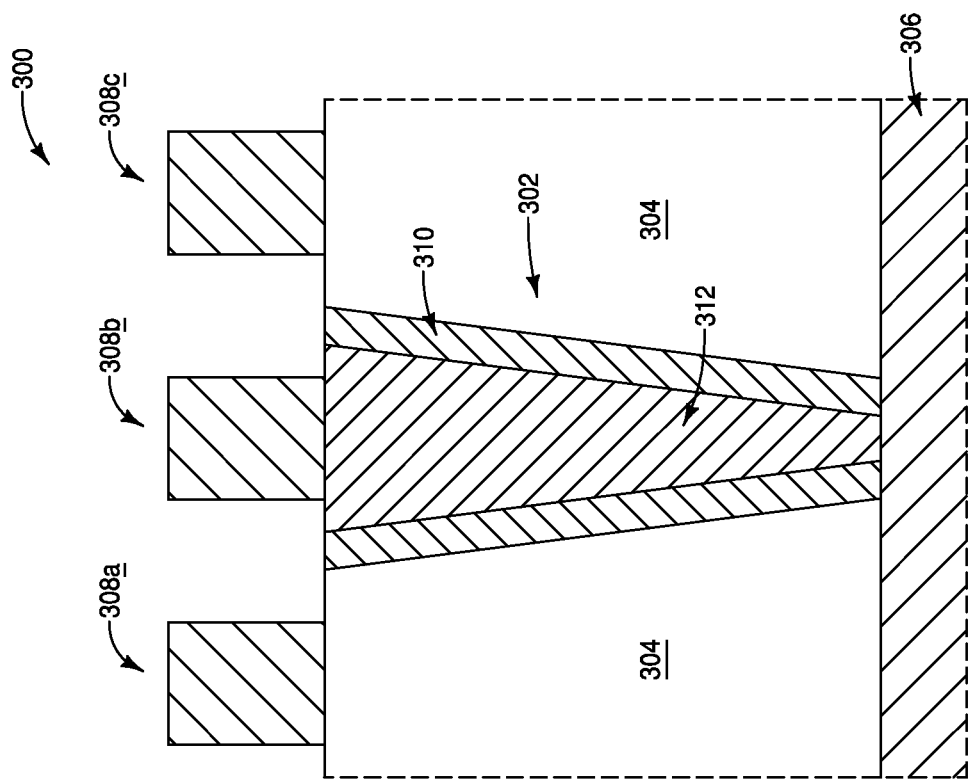
Figure 2B:
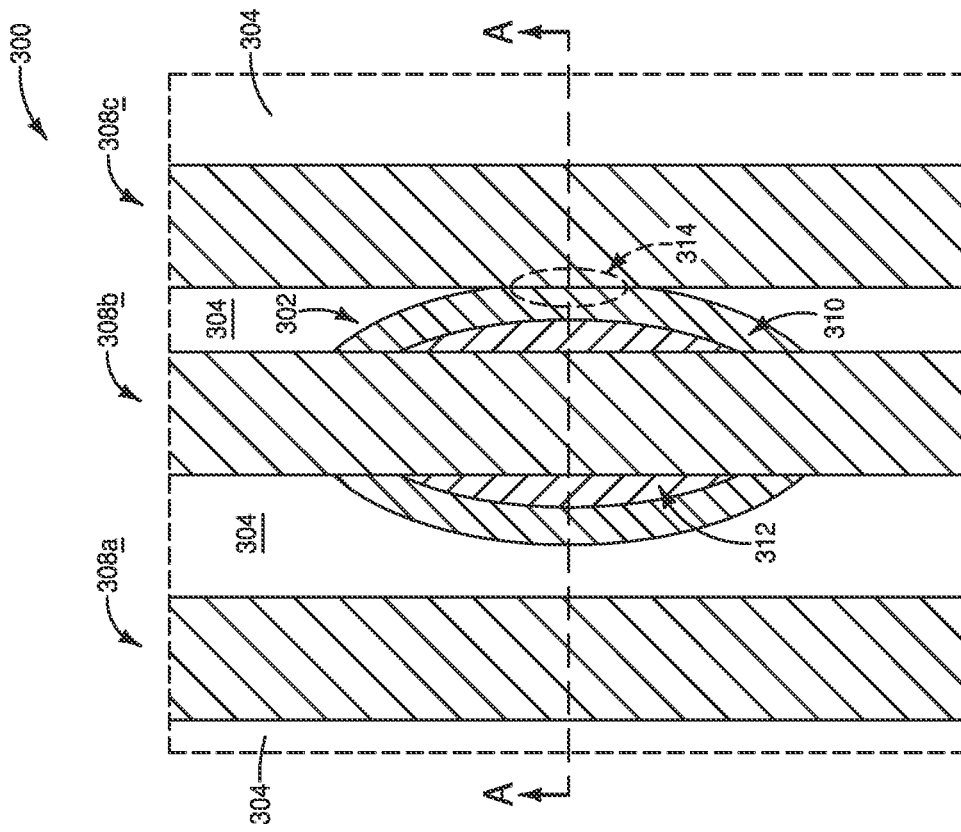
FIGS. 2A and 2B are a diagrammatic cross-sectional side view and a diagrammatic top-down view of a region of another prior art integrated assembly. The view of FIG. 2A is along the line A-A of FIG. 2B.
Figure 2A:
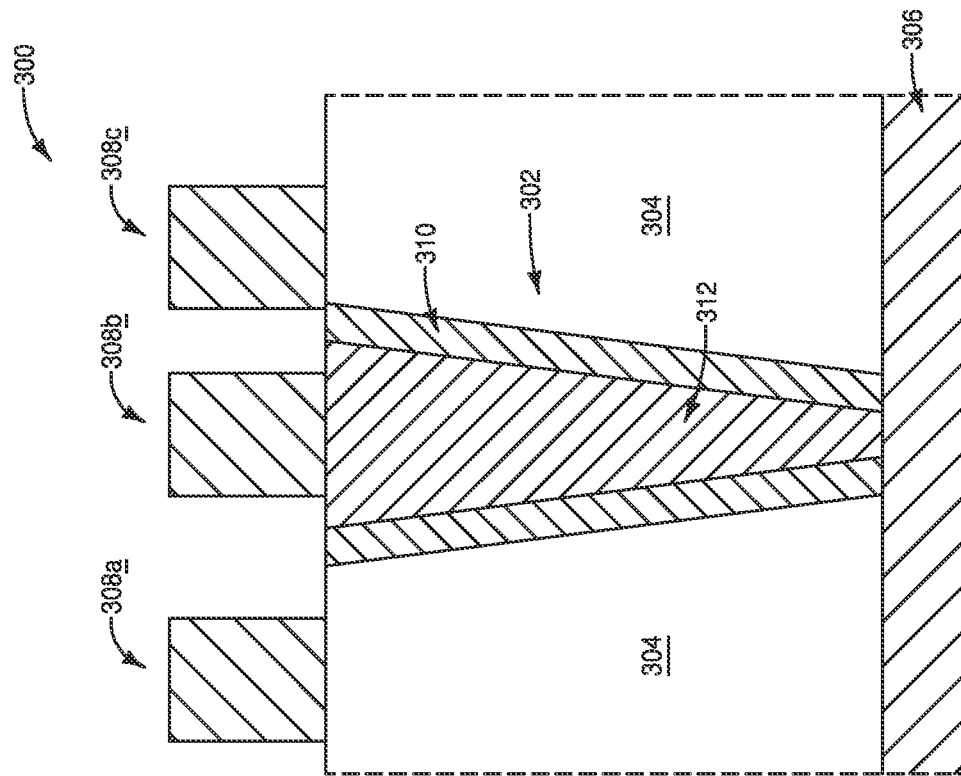

An advantage of the configuration of FIG. 10B relative to the conventional configurations described in the Background section (FIGS. 1A, 1B, 2A and 2B) is that the electrical coupling to the central line 54b is through the relatively narrow region 40 of the interconnect 53 (FIG. 10). Such may prevent the problematic shorting described above with reference to FIGS. 2A and 2B, and may thereby advantageously enable future generations of integrated circuitry to be scaled to higher levels of integration.

Figure 11:
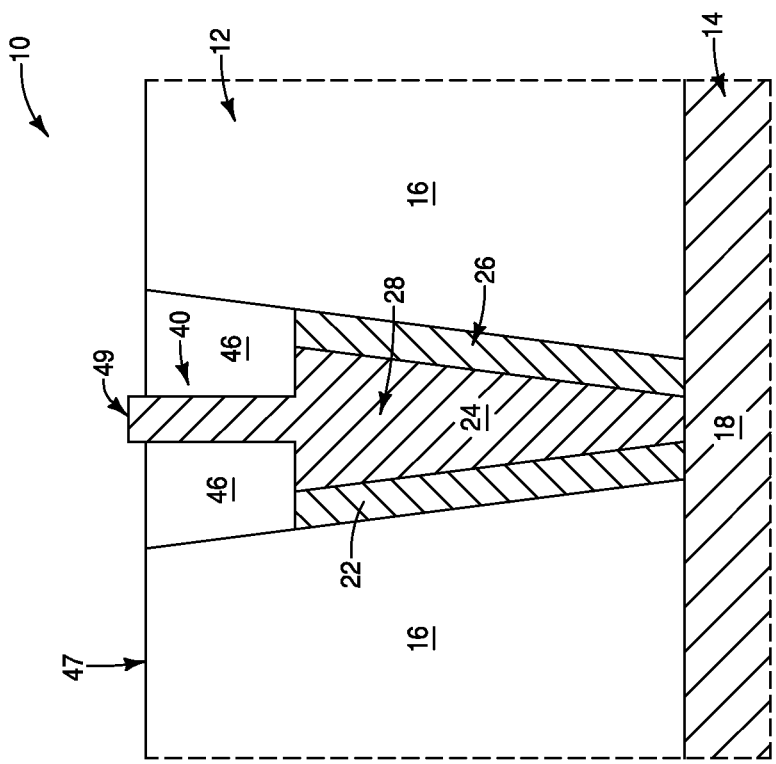
FIG. 11 is a diagrammatic cross-sectional side view of a region of an integrated assembly at an example process stage of an example method. The process stage of FIG. 11 may follow that of FIG. 9.

The process stage of FIG. 10 shows a configuration in which the upper surface 49 of the slender region 40 of the conductive core 28 is substantially coplanar with the upper surface of the material 16 of the insulative mass 12. In other embodiments, the upper surface 49 may be above or below the upper surface of the material 16, even though the surface 47 is substantially coplanar, depending on the relative compositions of materials 24, 46 and 16, and depending on the planarization process utilized to form the surface 47. FIG. 11 shows the assembly 10 at a process stage analogous to that of FIG. 10 in an example embodiment in which the upper surface 49 of the slender region 40 projects above the upper surfaces of the insulative materials 16 and 46.

Figure 13:
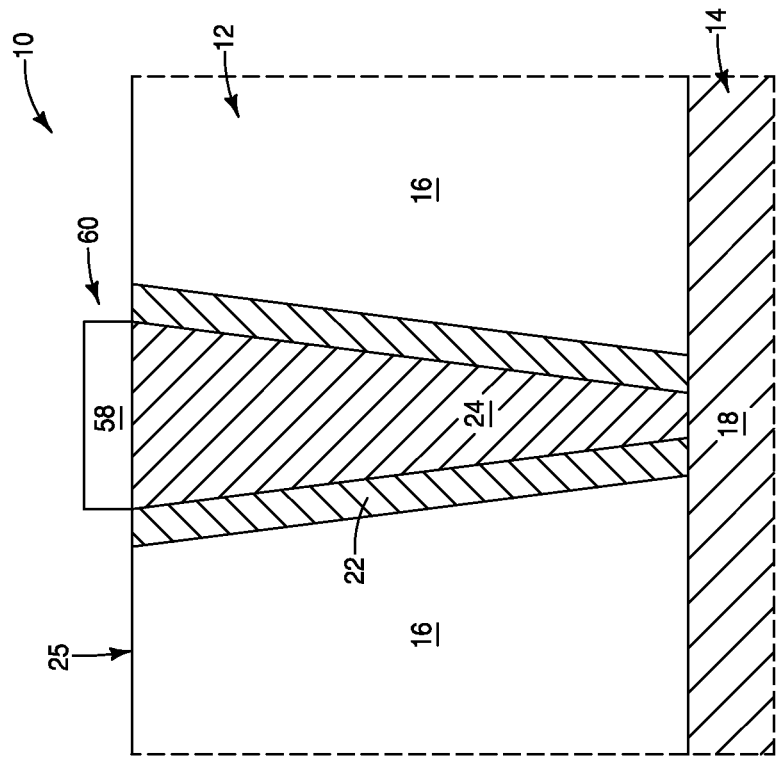
FIG. 13 is a diagrammatic cross-sectional side view of a region of an integrated assembly at an example process stage of an example method. The process stage of FIG. 13 may follow that of FIG. 6.
Figure 12:
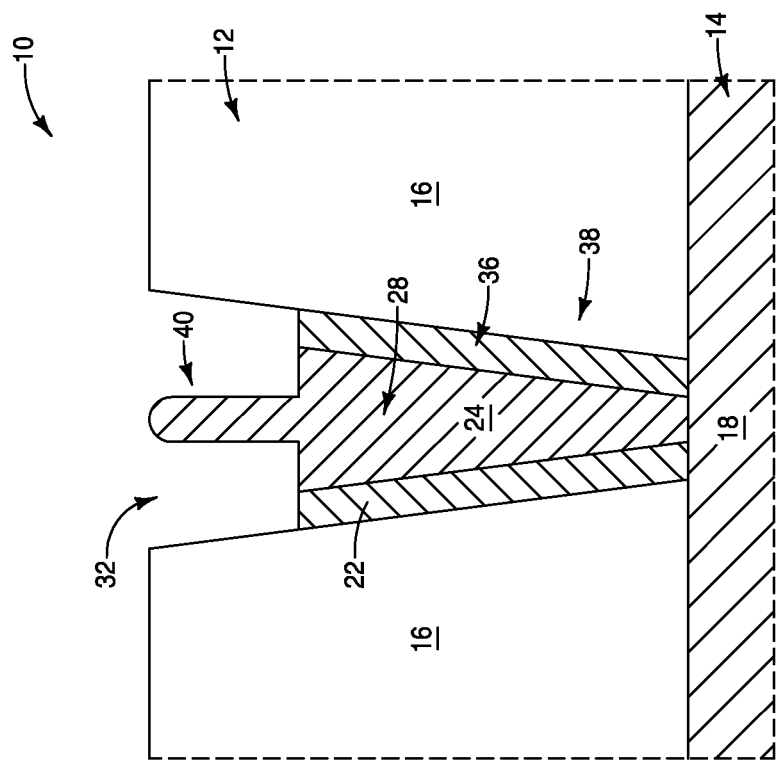
FIG. 12 is a diagrammatic cross-sectional side view of a region of an integrated assembly at an example process stage of an example method. The process stage of FIG. 12 may follow that of FIG. 7.

The process stage of FIG. 8 shows a configuration in which an upper surface of the slender region 40 of the conductive core 28 remains substantially flat after the formation of the moat 32 (FIG. 7) and the thinning of the upper region of the core material 24 to create the slender region 40 (FIG. 8). In other embodiments, the upper surface of the slender region 40 may become rounded during the etching utilized to form the moat 32 and/or during the etching utilized to thin the upper region of the core material. For instance, FIG. 12 shows the assembly 10 at a process stage analogous to that of FIG. 8, but in which the upper surface of the slender region 40 is undesirably rounded. If such rounding is found to be problematic, a protective structure (e.g., capping structure) may be provided over the core material 24 to protect such material during subsequent etching processes. FIG. 13 shows a process stage analogous to that of FIG. 6, but in which a protective capping material 58 is provided over the conductive core material 24. The protective capping material 58 may comprise any suitable composition(s); and in some embodiments may comprise, consist essentially of, or consist of metal oxide (e.g., titanium oxide, tungsten oxide, etc.), carbon, photoresist, etc. The protective material 58 may be patterned with any suitable processing. The protective material 58 may be considered to be configured as a protective cap 60.

Figure 14:
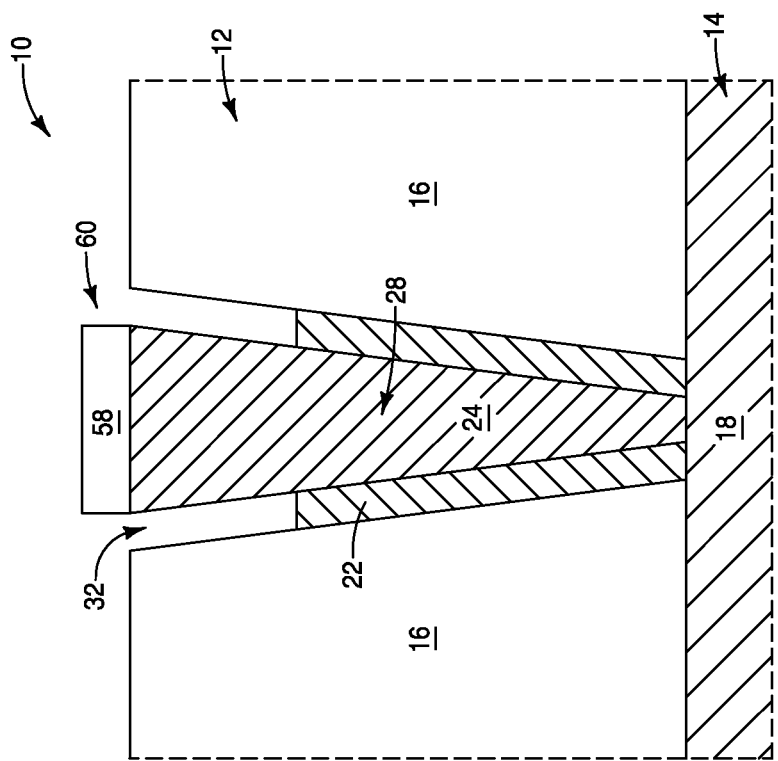

Referring to FIG. 14, the moat 32 is formed with processing analogous to that described above with reference to FIG. 7. The protective material 58 protects an upper surface of the conductive core material 24 during the formation of such moat.

Figure 15:
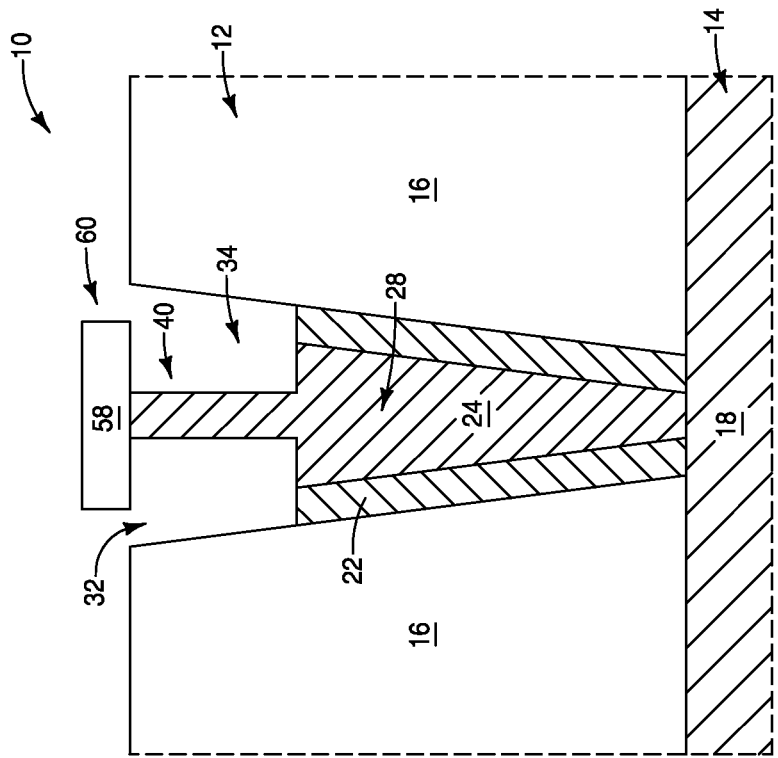
FIGS. 14-17 are diagrammatic cross-sectional side views of a region of an integrated assembly at sequential process stages of an example method. The process stage of FIG. 14 may follow that of FIG. 13.

Referring to FIG. 15, the lateral width of the upper region 34 of the core structure 28 is reduced with processing analogous that described above with reference to FIG. 8, and such forms the slender region 40. The protective material 58 protects the upper surface of the conductive core material 24 during such processing.

Figure 16:
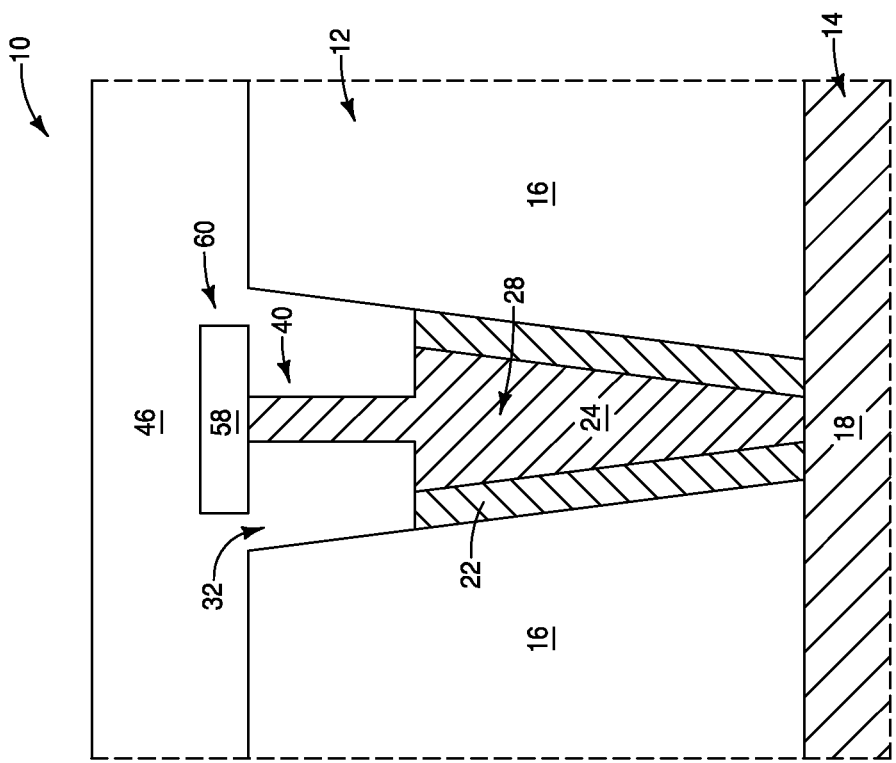
Figure 19:
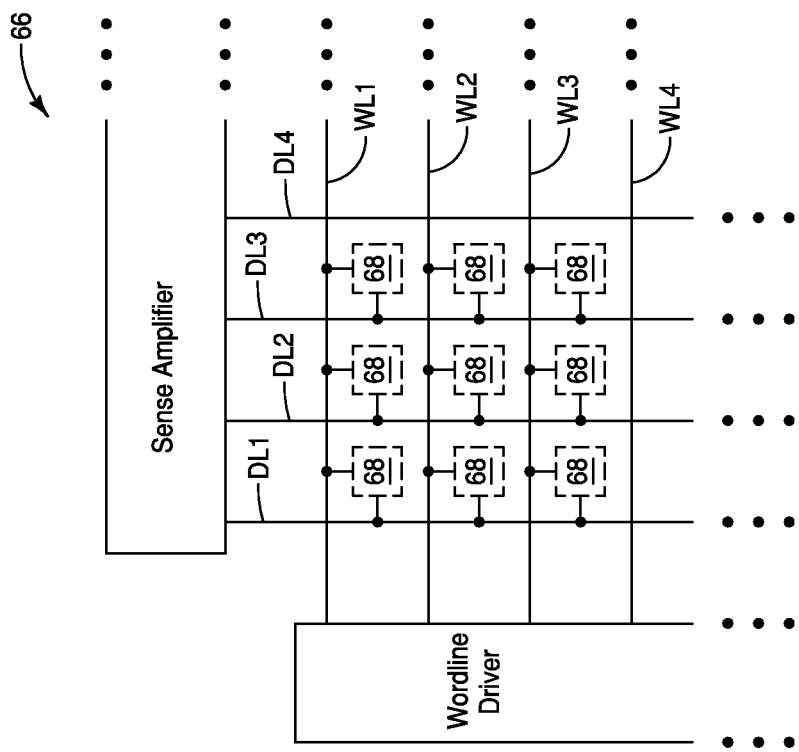
FIG. 19 is a diagrammatic schematic view of a region of an example memory array.

Referring to FIG. 16, the insulative material 46 is formed within the moat 32 and over the protective material 58 with processing analogous to that described above with reference to FIG. 9.

Figure 17:
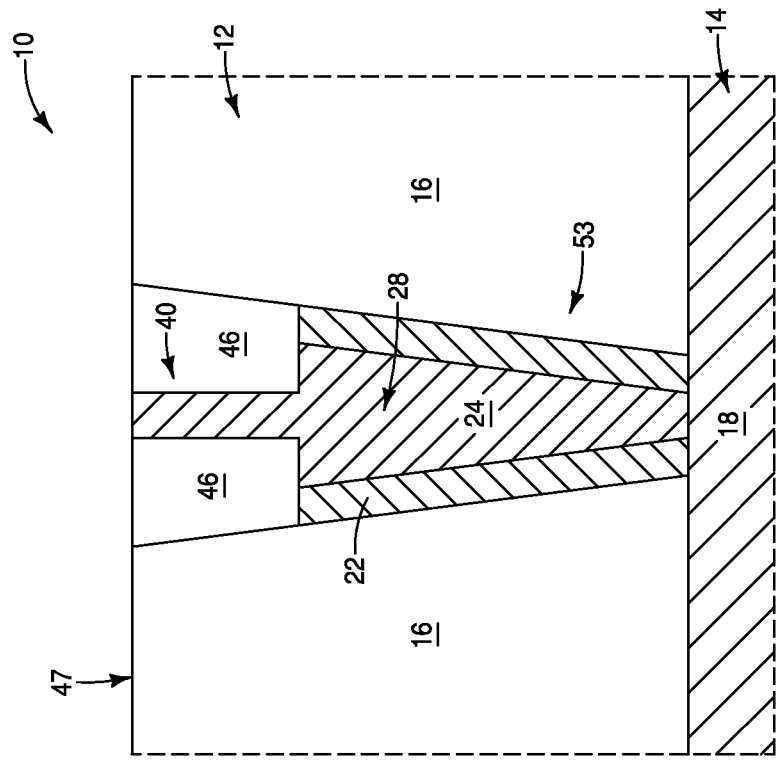

Referring to FIG. 17, the substantially planar surface 47 is formed with processing analogous to that described above with reference to FIG. 10, and such removes the protective material 58. The process stage of FIG. 17 is analogous to that described above with reference to FIG. 10 and accordingly the assembly 10 of FIG. 17 comprises a conductive interconnect 53 analogous to that described above with reference to FIG. 10.

Figure 18:
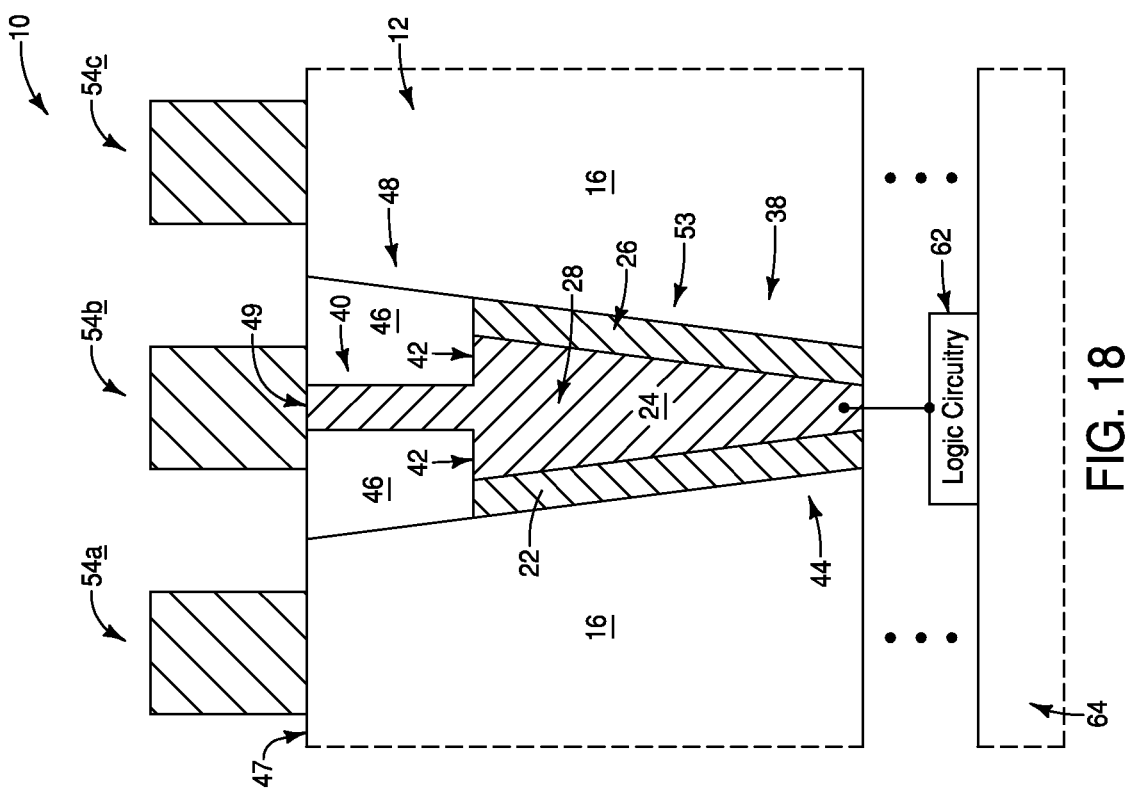
FIG. 18 is a diagrammatic cross-sectional side view of a region of an integrated assembly at an example process stage of an example method. The process stage of FIG. 18 may follow that of FIG. 17 or that of FIG. 10, and may be equivalent to that of FIG. 10B.

The conductive interconnects 53 of FIGS. 10 and 17 may be utilized for coupling wordlines and/or bitlines to underlying logic circuitry. For instance, FIG. 18 shows the assembly 10 at a process stage which may be analogous to that described above with reference to FIG. 10B. The conductive structures 54a-c are formed across the substantially planar upper surface 47, with the central conductive structure 54b being directly against the upper surface 49 of the slender region 40 of the core structure 28. The conductive structures 54a-c may be wordlines or bitlines.

The conductive interconnect 53 electrically couples the conductive structure 54b with the logic circuitry 62 under such conductive structure. The coupling to the logic circuitry may be through the conductive structure 14 (shown in FIGS. 10 and 17). The logic circuitry 62 may comprise CMOS (complementary metal oxide semiconductor). If the structure 54b is a wordline, the logic circuitry 62 may comprise wordline-driver-circuitry. If the structure 54b is a bitline, the logic circuitry 62 may comprise sense-amplifier-circuitry.

The logic circuitry 62 is supported by a base 64. The base 64 may comprise a semiconductor substrate; and in some embodiments may comprise monocrystalline silicon of a wafer or die.

The base 64 is shown to be spaced from the interconnect 53 by a gap to indicate that other components and/or materials may be provided between the base 64 and the interconnect 53.

In some embodiments, the structures 54a-c may be wordlines or bitlines extending across a memory array. An example memory array 66 is described with reference to FIG. 19. The memory array includes digit lines (bitlines) DL1-DL4 extending along columns of the array, and includes wordlines WL1-WL4 extending along rows of the array. Memory cells 68 are addressed with the wordlines and the digit lines; with each memory cell being uniquely addressed by a combination comprising one of the wordlines and one of the digit lines. The memory cells may be DRAM (dynamic random-access memory) cells or any other suitable memory cells. If the memory cells are DRAM cells, each of the memory cells may comprise one transistor and one capacitor, or may comprise any other suitable combination of transistors and capacitors. The memory array of FIG. 19 may be considered to be generically representative of any suitable memory array, including, for example, a three-dimensional cross-point memory array.

The wordlines (e.g. WL1) are shown be coupled with wordline-driver-circuitry (indicated as Wordline Driver), and the digit lines (e.g., DL1) are shown to be coupled with sense-amplifier-circuitry (indicated as Sense Amplifier). The wordline-driver-circuitry and sense-amplifier-circuitry may be within the logic circuitry 62 of FIG. 18. At least some portion of the wordline-driver-circuitry and/or at least some portion of the sense-amplifier-circuitry may be directly under the memory cells 68 of the memory array 66.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first conductive structure, and having an interconnect over the first conductive structure and electrically coupled with the first conductive structure. The interconnect includes a conductive core structure having a conductive core material. The conductive core structure has, along a cross-section, an upper region which includes a slender portion of the conductive core material, and a lower region which includes a wide portion of the conductive core material. The upper region joins to the lower region at a step. A liner laterally surrounds the lower region of the conductive core structure. The liner has an upper surface which is substantially coplanar with the step. An insulative collar is over and directly against both an upper surface of the step and the upper surface of the liner. The insulative collar laterally surrounds and directly contacts the slender portion of the conductive core material. A second conductive structure is over and directly against a region of the insulative collar, and is over and directly against an upper surface of the slender portion of the conductive core material.

Some embodiments include an integrated assembly having a first conductive structure electrically coupled with logic circuitry and a second conductive structure over the first conductive structure and electrically coupled with the first conductive structure. The second conductive structure has, along a cross-section, an upper narrow region and a lower wide region. The upper narrow region joins to the lower wide region at a step. A conductive collar laterally surrounds the lower wide region of the second conductive structure. An insulative collar laterally surrounds the upper narrow region of the second conductive structure. A lower surface of the insulative collar is along an upper surface of the step and is along an upper surface of the conductive collar. A third conductive structure extends across a region of the insulative collar and across an upper surface of the upper narrow region of the second conductive structure. The third conductive structure is electrically coupled with the first conductive structure through the second conductive structure, and is a wordline or a digit line.

Some embodiments include a method of forming an integrated assembly. An opening is formed to extend through an insulative mass to an upper surface of a first conductive structure. A liner material is formed within the opening to line sidewalls of the opening. A core material is formed within the opening and along the lined sidewalls of the opening. The core material may directly contact the first conductive structure. A first substantially planar surface is formed to extend across the insulative mass, the liner material and the core material. The formation of the first substantially planar surface patterns the core material within the opening into a core structure and patterns the liner material within the opening into a liner that laterally surrounds an outer periphery of the core structure. An upper portion of the liner is removed to form a moat around an upper region of the core structure. A lower portion of the liner remains as a first collar under the moat and laterally surrounds a lower region of the core structure. A lateral width of the upper region of the core structure is reduced to convert the upper region to a slender region of the core structure. The lower region of the core structure is a wide region of the core structure and joins to the slender region of the core structure at a step. An insulative material is formed over the slender region of the core structure and within the moat. A second substantially planar surface is formed to extend across the insulative material, the insulative mass and an upper surface of the slender region of the core structure. The formation of the second substantially planar surface patterns the insulative material into an insulative collar which laterally surrounds the slender region of the core structure. A second conductive structure is formed directly against the upper surface of the slender region of the core structure.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
   forming an opening to extend through an insulative mass to an upper surface of a first conductive structure;
   forming a liner material within the opening to line sidewalls of the opening;
   forming a core material within the opening and along the lined sidewalls of the opening;
   forming a first substantially planar surface extending across the insulative mass, the liner material and the core material; the forming of the first substantially planar surface patterning the core material within the opening into a core structure and patterning the liner material within the opening into a liner that laterally surrounds an outer periphery of the core structure;
   removing an upper portion of the liner to form a moat around an upper region of the core structure; a lower portion of the liner remaining as a first collar under the moat and laterally surrounding a lower region of the core structure;
   reducing a lateral width of the upper region of the core structure to convert the upper region of the core structure to a slender region of the core structure; the lower region of the core structure being a wide region of the core structure and joining to the slender region of the core structure at a step;
   forming an insulative material over the slender region of the core structure and within the moat;
   forming a second substantially planar surface to extend across the insulative material, the insulative mass and an upper surface of the slender region of the core structure; the forming of the second substantially planar surface patterning the insulative material into an insulative collar which laterally surrounds the slender region of the core structure; and
   forming a second conductive structure directly against the upper surface of the slender region of the core structure.

2. The method of claim 1 further comprising forming protective cap over an upper surface of the core material after forming the first substantially planar surface and prior to forming the moat.

3. The method of claim 2 further comprising removing the protective cap during the formation of the second substantially planar surface.

4. The method of claim 1 wherein the second conductive structure is a wordline or a digit line.

5. The method of claim 1 wherein the liner material is a conductive material.

6. The method of claim 1 wherein the liner material is an insulative material.

7. The method of claim 1 wherein the core material comprises only a single homogenous composition.

8. The method of claim 1 wherein the core material consists essentially of one or more metals; and wherein the liner material comprises metal nitride.

9. The method of claim 1 wherein the core material consists essentially of tungsten; and wherein the liner material comprises one or both of tungsten nitride and titanium nitride.

10. The method of claim 1 wherein the core material comprises metal; and wherein the liner material comprises one or more of silicon nitride, silicon dioxide and aluminum oxide.

11. The method of claim 1 wherein the insulative material comprises one or both of silicon nitride and silicon dioxide.

12. The method of claim 1 wherein the insulative mass comprises silicon dioxide.

13. The method of claim 1 wherein the core material directly contacts the first conductive structure.

14. A method of forming an integrated assembly, comprising:
   forming a first conductive structure;
   forming an interconnect over the first conductive structure and electrically coupled with the first conductive structure; the interconnect including a conductive core having an upper region which includes a slender portion of conductive core material, and a lower region which includes a wide portion of the conductive core material; the upper region joining to the lower region at a step;
   forming a liner laterally surrounding the lower region of the conductive core structure; the liner comprising a first composition having an upper surface which is substantially coplanar with the step and being absent from the upper region of the conductive core structure;
   forming an insulative collar comprising a second composition that differs from the first composition, the insulative collar being formed over and directly against both an upper surface of the step and the upper surface of the liner; the second composition of the insulative collar laterally surrounding and directly contacting the slender portion of the conductive core material; and
   forming a second conductive structure over and directly against the insulative collar, and over and directly against an upper surface of the slender portion of the conductive core material.

15. The method of claim 14 wherein the liner comprises conductive material.

16. The method of claim 14 wherein the liner comprises insulative material.

17. The method of claim 14 wherein the insulative collar has an upper surface laterally surrounding the upper surface of the slender portion of the core material; wherein the upper surfaces of the insulative collar and the slender portion of the core material are together an upper surface region; wherein a cross-section through the upper surface region has a first width; wherein the portion of the upper surface of the core material along such cross-section has a second width; and wherein a ratio of the second width to the first width is within a range of from about 0.01 to about 0.9.

18. A method of forming an integrated assembly, comprising:
   forming a first conductive structure electrically coupled with logic circuitry;
   forming a second conductive structure over the first conductive structure and electrically coupled with the first conductive structure; the second conductive structure having, along a cross-section, an upper narrow region and a lower wide region; the upper narrow region joining to the lower wide region at a step;
   forming a conductive collar laterally surrounding the lower wide region of the second conductive structure, the conductive collar having tapered sidewalls;

forming an insulative collar laterally surrounding the upper narrow region of the second conductive structure; a lower surface of the insulative collar being along an upper surface of the step and being along an upper surface of the conductive collar; the insulative collar having tapered sidewalls extending from the tapered sidewalls of the conductive collar; and forming a third conductive structure extending across a region of the insulative collar and across an upper surface of the upper narrow region of the second conductive structure; the third conductive structure being electrically coupled with the first conductive structure through the second conductive structure, and being a wordline or a digit line.

19. The method of claim 18 wherein the second conductive structure comprises only a single homogenous composition.

20. The method of claim 18 wherein the second conductive structure consists essentially of one or more metals.

* * * * *